United States Patent [19]

Somekh et al.

[11] Patent Number: 5,250,467
[45] Date of Patent: Oct. 5, 1993

[54] METHOD FOR FORMING LOW RESISTANCE AND LOW DEFECT DENSITY TUNGSTEN CONTACTS TO SILICON SEMICONDUCTOR WAFER

[75] Inventors: Sasson Somekh, Los Altos Hills; Jaim Nulman, Palo Alto; Mei Chang, Cupertino, all of Calif.

[73] Assignee: Applied Materials, Inc., Santa Clara, Calif.

[21] Appl. No.: 677,681

[22] Filed: Mar. 29, 1991

[51] Int. Cl.$^5$ ...................... H01L 21/44; H01L 21/48
[52] U.S. Cl. .................................... 437/192; 437/193; 437/200
[58] Field of Search ................. 437/192, 193, 195–200

[56] References Cited

U.S. PATENT DOCUMENTS

| | | |
|---|---|---|
| 4,784,973 | 11/1988 | Stevens et al. . |
| 4,920,073 | 4/1990 | Wei et al. . |
| 4,994,410 | 2/1991 | Sun et al. ............... 148/DIG. 35 |
| 5,010,032 | 4/1991 | Tang et al. . |
| 5,028,565 | 7/1991 | Chang et al. .................. 437/190 |
| 5,043,300 | 8/1991 | Nulman ......................... 437/200 |
| 5,102,826 | 4/1992 | Ohshima et al. ............... 437/192 |

FOREIGN PATENT DOCUMENTS

| | | | |
|---|---|---|---|
| 63-9925 | 1/1988 | Japan ......................... 437/200 |
| 2-026051 | 1/1992 | Japan ......................... 437/200 |

OTHER PUBLICATIONS

Tsukamoto et al. "Self Aligned Titanium Silicidation by Lamp Annealing" Japanese Journal of Applied Physics, Supplements 16th Int. Conf. Solid States Devices and Mat. pp. 47–50 (1984).

Primary Examiner—Olik Chaudhuri
Assistant Examiner—Loc Q. Trinh
Attorney, Agent, or Firm—John P. Taylor

[57] ABSTRACT

An improved process is described for forming planar tungsten-filled contacts to a silicon substrate in contact openings through an insulating layer which provides for the formation of titanium silicide in and on the silicon surface at the bottom of the contact openings to provide low resistance silicide interconnections between the silicon substrate and the tungsten. A titanium nitride layer is formed over the titanium silicide and on the surfaces of the insulation layer, including the top surface of the insulation layer and the sidewall surfaces of the contact openings through the insulating layer. This titanium nitride layer provides a nucleation layer which permits a good bond to form from the tungsten through the titanium nitride and titanium silicide in the contact openings to the silicon substrate; and from the tungsten through the titanium nitride layer to the insulator material such as silicon dioxide ($SO_2$), resulting in the formation of low resistance and low defect density contacts.

18 Claims, 2 Drawing Sheets

METHOD FOR FORMING LOW RESISTANCE AND LOW DEFECT DENSITY TUNGSTEN CONTACTS TO SILICON SEMICONDUCTOR WAFER

BACKGROUND OF THE INVENTION

1. Field of the Invention

This invention relates to a method for forming low resistance and low defect density contacts on a silicon semiconductor wafer. More particularly, the invention relates to forming a low resistance contact between a silicon semiconductor wafer and a first metallization layer through a high aspect ratio contact opening in an insulating layer.

2. Description of the Related Art

In the formation of integrated circuit structures, it is necessary to provide electrical contact to portions of the silicon semiconductor substrate surface through openings in an insulator formed over the substrate, e.g., to provide electrical contact to one of the electrodes of an MOS or a bipolar device. Conventionally, this is carried out by filling the contact opening with a conductive material such as aluminum. However, the use of a metal such as aluminum for filling contact openings has become unsatisfactory in some instances, particularly where the aspect ratios (height/width) of such contact openings has increased to ratios greater than one 1.

It has, therefore, been proposed to fill such contact openings with tungsten, due to its low resistance and ability to deposit conformally in contact openings, even when the opening has an aspect ratio of 1 or higher. However, tungsten does not make a good (low resistance) electrical contact with the surface of the silicon substrate beneath an insulator through which the contact opening is made, nor does the tungsten adhere very well to the sidewall surfaces of the contact opening through the insulator.

Several prior art approaches toward solutions to the problems which have arisen with the use of tungsten to fill the contact opening have been proposed. These prior art approaches include, first of all, the preliminary physical vapor deposition (PVD) of an intermediate titanium nitride layer on the walls of the opening through reactive sputtering of titanium nitride material from a titanium or titanium nitride target prior to filling the opening with tungsten. This formation of a titanium nitride layer over the insulator provides a chemical barrier which inhibits the subsequent tungsten CVD process from interacting with the underlying silicon substrate which interaction could result in tungsten encroachment into the contact causing large leakage current and non-functional devices.

This first approach requires a first or preliminary step of forming a silicide over and in the exposed silicon surface of the substrate before the titanium nitride deposition, since the titanium nitride does not form a good low resistance contact to silicon.

The use of this type of process is particularly objectionable, however, because of the generation of high levels of titanium nitride particles, resulting in a high density of defects in the integrated circuit structures on the wafer, which, in turn, leads to low yields.

It has also been proposed to physically deposit a titanium/tungsten (TiW) alloy or compound by reactive sputtering or other PVD methods, prior to filling the opening with tungsten. But this type of process has also been found to result in undesirable particle formation and deposition during the PVD formation of the titanium/tungsten alloy coating.

A third method has also been proposed wherein a layer of titanium is first deposited on the exposed silicon substrate and the insulator sidewalls by a PVD method such as sputtering followed by sputter deposition of a layer of titanium nitride. The structure is then annealed to cause the deposited titanium over the silicon to react with the silicon to form a silicide in and on the silicon surface, prior to filling the opening with tungsten.

However, when an annealing temperature of less than about 500° C. is used, the type of silicide formed is not the desired low resistance type; while when a higher annealing temperature is used, silicon is found to migrate from the substrate to form titanium silicide along the walls of the contact opening, resulting in depletion of the silicon in the substrate adjacent the contact and, therefore, a non-functional device.

It would, therefore, be desirable to provide a process for the filling of a high aspect ratio contact opening in an insulator with tungsten, wherein a good electrical contact could be formed between the tungsten and the silicon substrate at the bottom of the contact opening, while providing good adherence of the tungsten to the surfaces of the insulator, without the formation of undesirable particles which characterizes prior art processes for filling such a contact opening with tungsten, and without the prior art migration of the silicon from the substrate to form titanium silicide along the walls of the contact opening which, in such prior art processes, resulted in depletion of the silicon in the substrate adjacent the contact.

SUMMARY OF THE INVENTION

The process of the invention provides for the formation of a tungsten-filled contact opening through an insulator, such as $SiO_2$, to a silicon substrate comprising the steps of: a) first depositing a layer of titanium over the surfaces of a insulator, including the sidewall surfaces of the contact opening through the insulator, and the exposed silicon substrate surface at the bottom of the contact opening; b) then annealing the titanium-coated surfaces in a nitrogen-bearing atmosphere at a temperature at which the titanium will react with the exposed silicon to form a bilayer of titanium nitride and a low resistance titanium silicide on the silicon substrate, and which will react with the nitrogen-bearing gases to form titanium nitride on the surfaces of the insulator layer, without exposing the titanium coated surfaces to oxygen-bearing gases after the titanium deposition; and c) then filling the remainder of the contact opening with tungsten which will physically adhere to both the titanium nitride and the surfaces of the titanium nitride/titanium silicide bilayer, and which will make good electrical contact to the silicon through the titanium silicide surface on the silicon substrate.

DETAILED DESCRIPTION OF THE INVENTION

The invention comprises an improved process for forming a tungsten-filled contact to a silicon substrate in a contact opening through an insulating layer which provides for the deposition of a titanium layer by sputtering, the formation of a bilayer of titanium nitride and titanium silicide in and on the silicon surface at the bottom of the contact opening to provide a low resistance silicide contact between the silicon substrate and the tungsten, and the formation of a titanium nitride layer on the surfaces of the insulating layer to provide a nucleation layer which permits a good bond to form between the tungsten in the contact opening and the insulator material such as silicon oxide, resulting in a low density of defects on the wafer. The process is particularly useful for filling high aspect ratio contact openings.

By use of the term "low resistance silicide interconnection" between the silicon substrate and the tungsten metal is meant a silicide with a sheet resistivity of less than 3 ohms/square, as compared to prior art silicides having a sheet resistance of from 3 to 30 ohms/square when annealed at a temperature less than 500° C.

By use of the term "high aspect ratio" is meant a contact opening having a height to width ratio of at least 1.

Figure 1:
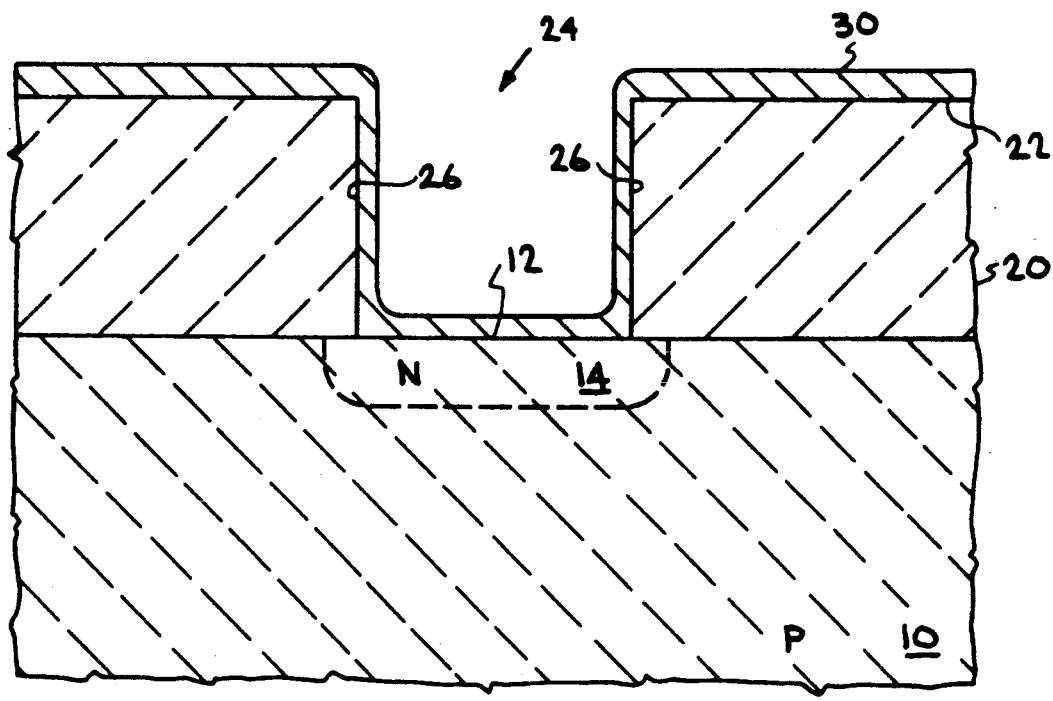
FIG. 1 is a fragmentary vertical side-section view of a silicon semiconductor wafer having an insulator layer thereon with a contact opening formed through the insulator layer to the silicon substrate and a titanium layer deposited over the sidewalls of the contact opening, as well as over the exposed silicon surface at the bottom of the contact opening.

Turning now to FIG. 1, a portion of an integrated circuit structure is shown comprising a fragmentary portion of a silicon wafer or substrate 10, having an insulating layer 20 formed thereon. Insulating layer 20 may comprise a silicon dioxide ($SiO_2$) insulation material, a boron glass, phosphorus glass, or boron/phosphorus glass, or any other material which is an insulator.

A previously formed contact opening 24 is shown in insulating layer 20 which exposes a portion 12 of the silicon surface of substrate 10 which overlies a region or area 14 in substrate 10 to which it is desired to provide electrical communication. Region 14, for example, might comprise a source or drain region of an MOS transistor, or a collector region of a bipolar transistor, formed in substrate 10.

A layer of titanium 30 is shown already deposited over the structure, including top surface 22 of insulator layer 20, the sidewall surfaces 26 of contact opening 24, and over exposed top surface 12 of silicon substrate 10.

The thickness of titanium layer 30 will vary, depending upon the particular location of the titanium. For example, the thickness of the deposited titanium layer may vary from about 500 to about 5000 Angstroms over top surface 22 of insulator layer 20; while the titanium thickness over surface 12 of silicon substrate 10 at the bottom of contact opening 24 may vary from about 50 to about 1000 Angstroms.

Titanium layer 30 may be deposited over insulating layer 20, including sidewall surfaces 26 as well as top surface 22, and over exposed portion 12 of silicon substrate 10 using the process described in copending Nulman et al. U.S. patent application Ser. No. 07/510,307 filed Apr. 16, 1990, assigned to the assignee of this invention, and entitled "INTEGRATED PROCESSING SYSTEM FOR FORMING TITANIUM SILICIDE ON SEMICONDUCTOR WAFER", cross-reference to which is hereby made. Such a titanium deposition comprises first the optional initial cleaning of the structure, for example, by a reactive ion process, using one or more fluorine-bearing gases and an inert gas such as argon.

Following the cleaning of the structure, the titanium is deposited over the structure using a conventional PVD sputtering process, or any other suitable titanium deposition process. As described in the aforementioned Ser. No. 07/510,307, preferably the cleaned structure is transferred from the cleaning chamber to the titanium deposition chamber under vacuum to avoid exposing the cleaned surfaces to air or other oxygen-containing gases.

The titanium-coated structure shown in FIG. 1 is then transferred to an annealing chamber, without exposing the titanium surface to air or other oxygen-containing gases, and annealed in the presence of a nitrogen-bearing gas to form the titanium silicide and titanium nitride. The annealing is preferably carried out in accordance with the annealing process described and claims in Nulman Ser. No. 07/510,340, filed Apr. 16, 1990, now U.S. Pat. No. 5,043,300, assigned to the assignee of this invention, and entitled "SINGLE ANNEAL STEP PROCESS FOR FORMING TITANIUM SILICIDE ON SEMICONDUCTOR WAFER", cross-reference to which is hereby made.

As described in said Ser. No. 07/510,340 now U.S. Pat. No. 5,043,300, the anneal is carried out at an initial temperature ranging from about 500° C. to about 695° C., preferably from about 600° C. to about 675° C., to form the titanium nitride and titanium silicide, after which the temperature is raised to from about 800° C. to about 900° C. to convert to a more stable phase the titanium silicide initially formed at the lower temperature range. The pressure in the annealing chamber during the anneal is maintained within a range of from about 100 milliTorr to about 800 Torr.

The anneal is usually carried out under rapid thermal anneal conditions where the wafer temperature is rapidly ramped up to the annealing temperature at a rate of from about 5° C./second to about 150° C./second, typically about 80° C./second, and the portion of the annealing step conducted at the temperature range of from about 500° C. to about 695° C. is carried out for a period of from about 10 to about 60 seconds. The second temperature range portion of the anneal at from about 800° C. to about 900° C. is then carried out for an additional time period of from about 10 to about 60 seconds.

Oxygen-containing gases are excluded from the surfaces during the anneal, and a source of nitrogen is provided by flowing one or more nitrogen-bearing gases into the chamber at a rate ranging from about 500 to about 10,000 standard cubic centimeters/minute (sccm), depending upon the volume of the annealing chamber and the capacity of the vacuum pump.

Figure 2:
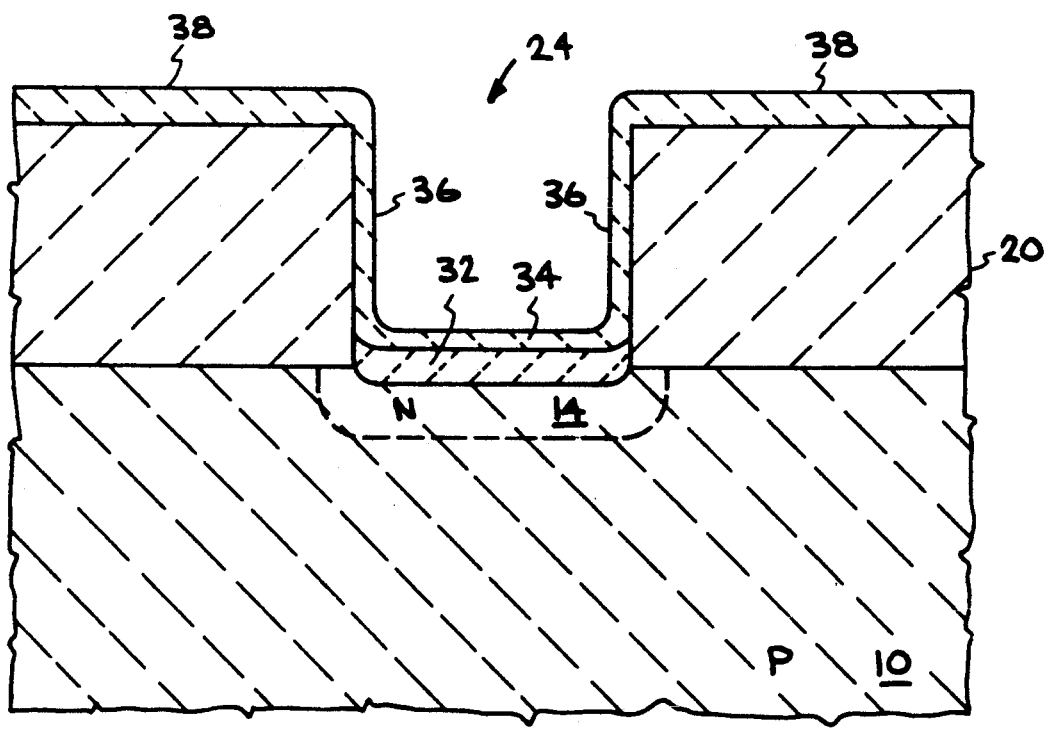
FIG. 2 is a fragmentary side-section view of the structure of FIG. 1 after annealing of the structure to form the bilayer of titanium nitride and titanium silicide over the silicon substrate at the bottom of the contact opening and titanium nitride on the surfaces of the insulator.

As shown in FIG. 2, titanium silicide 32 is formed at the bottom of contact opening 24, in and on previously exposed silicon surface portion 12 over region 14 in silicon substrate 10, by reaction of the titanium with the exposed silicon. Titanium nitride 34 is shown formed over silicide 32, titanium nitride 36 is shown formed over the exposed sidewall surfaces 26 of insulating layer 20 in contact opening 24, and titanium nitride 38 is shown formed over top surface 22 of insulating layer 20. Titanium nitride 34, 36, and 38 is formed by reaction of the titanium with the nitrogen gas present in the annealing chamber during the anneal.

It should be noted here, that the exclusion of oxygen-containing gases from the titanium surface prior to the annealing step prevents or mitigates formation of titanium oxides on the titanium surfaces. The presence of titanium oxides on or in the titanium layer have been found to inhibit the penetration of the nitrogen atoms into the titanium, which could result in formation of titanium silicide on sidewall surfaces 26 of contact opening 24. Such titanium silicide formation would be undesirable, as discussed with respect to the prior art processes, because silicon migration from silicon substrate 10 to form such titanium silicide would result in a depletion of silicon in region 14 of silicon substrate 10 adjacent contact opening 24.

After the formation of titanium nitride 34, 36, and 38, a controlled oxygen-bearing heat treatment could be included to allow for different types of tungsten CVD nucleations, as is well known to those skilled in the art. For example, such an oxygen-bearing heat treatment may be carried out in the same chamber used for the nitrogen-bearing anneal to form the titanium silicide and titanium nitride layers and within the same pressure range, i.e., from about 100 milliTorr to about 800 Torr, while maintaining the wafer temperature within a range of from about 300° C. to about 900° C. The anneal in the oxygen-bearing gaseous atmosphere may be carried out for a period of from about 10 to about 60 seconds by flowing an oxygen-bearing gas, such as oxygen or nitrous oxide ($N_2O$), through the annealing chamber.

In accordance with the invention, following the anneal in the nitrogen-bearing gas, and the optional subsequent anneal in the oxygen-bearing gas, a layer of tungsten is then deposited over the structure to fill the remainder of contact opening 24 with tungsten, as well as to provide a planar coating of tungsten over top surface 22 of insulating layer 20 and titanium nitride coating 38 formed thereon. Deposition of a layer of tungsten over the structure at this point may be carried out using any conventional tungsten deposition method.

For example, by way of illustration, and not of limitation, the tungsten deposition may be carried out in accordance with the tungsten deposition process described in copending Chang et al. U.S. patent application Ser. No. 07/398,653, filed Aug. 25, 1989, assigned to the assignee of this invention, and entitled "PROCESS FOR CVD DEPOSITION OF TUNGSTEN LAYER ON SEMICONDUCTOR WAFER", cross-reference to which is hereby made.

As disclosed in the aforementioned Ser. No. 07/398,653 now U.S. Pat. No. 5,028,505, tungsten may be deposited over the structure and into contact opening 24 to form the structure of FIG. 2 by first mounting the wafer on a susceptor in a CVD chamber, and then flowing a mixture of gases into the chamber which include a tungsten-containing gas, such as $WF_6$. During the CVD process, a pressure is maintained in the chamber within a range of from about 500 milliTorr to about 760 Torr, and preferably from about 20 Torr to about 760 Torr. The higher pressure range is preferred to provide a faster deposition rate.

During the deposition, the temperature of the susceptor on which the wafer is mounted is maintained within a range of from about 350° C. to about 525° C., preferably within a range of from about 400° C. to about 475° C.

The tungsten may be deposited while flowing a mixture of $WF_6$, $N_2$, and $H_2$ gases and an inert carrier gas such as helium, neon, argon, krypton, or xenon through the deposition chamber at a rate of from about 10 to about 200 sccm of $WF_6$, preferably from about 20 to about 100 sccm; from about 100 to about 5000 sccm of an inert carrier gas such as argon, preferably from about 1000 to about 3000 sccm; from about 10 to about 300 sccm of nitrogen; and from about 300 to about 3000 sccm of hydrogen, preferably from about 500 to about 2000 sccm.

The deposited tungsten forms a good electrical contact with the bilayer of titanium nitride (34) and titanium silicide (32) at the bottom of contact opening 24. Titanium nitride 36 and 38 on the remaining surfaces of insulation layer 20 form a nucleation layer which facilitates adherence of the deposited tungsten, respectively, to sidewall surfaces 26 and top surface 22 of insulating layer 20.

It should be noted that while the use of nitrogen gas during the tungsten deposition, in combination with the other gases, is preferred, nitrogen can be eliminated from the gaseous mixture if the deposited tungsten will be later removed from the top surface of insulation layer 20. The nitrogen gas may optionally be omitted in such a case because one of the main purposes of the use of nitrogen gas, in combination with the other gases, is to provide a smooth tungsten surface to facilitate further photolithography.

Figure 3:
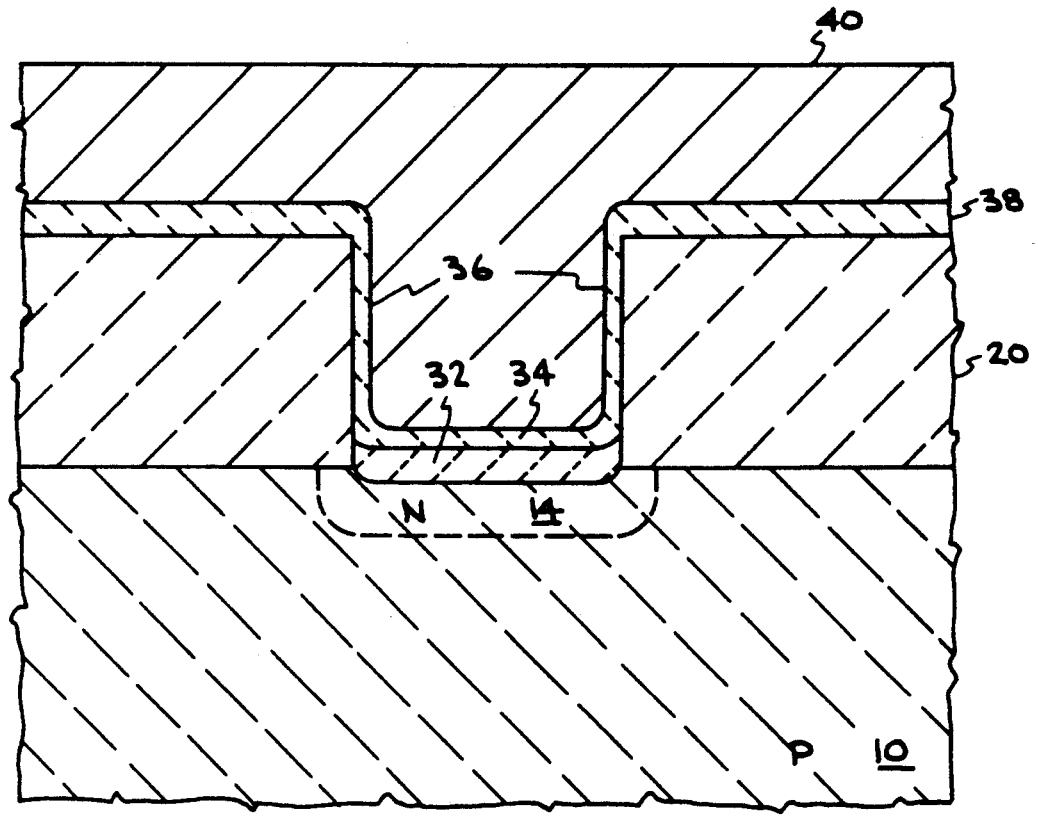
FIG. 3 is a fragmentary side-section view of the structure of FIG. 2 after a planarized layer of tungsten has been deposited on the entire wafer, including the contact opening.

Using the above described tungsten deposition parameters, the tungsten deposition rate, on either top surface 22 of insulation layer 20 or within contact opening 24, will range from about 500 to about 7000 Angstroms per minute. Therefore, for example, to ensure adequate filling of contact opening 24, when its width is about 1 micron, and the deposition rate is 500 Angstroms per minute, the tungsten deposition process should be carried out for at least about 1 minute, (since the tungsten deposits simultaneously on opposite sides of the contact opening) resulting in the structure shown in FIG. 3.

If it is desired to use deposited tungsten layer 40 on top surface 22 of insulating layer 20 as a wiring or interconnect layer, tungsten layer 40 may be masked and patterned at this point.

Figure 4:
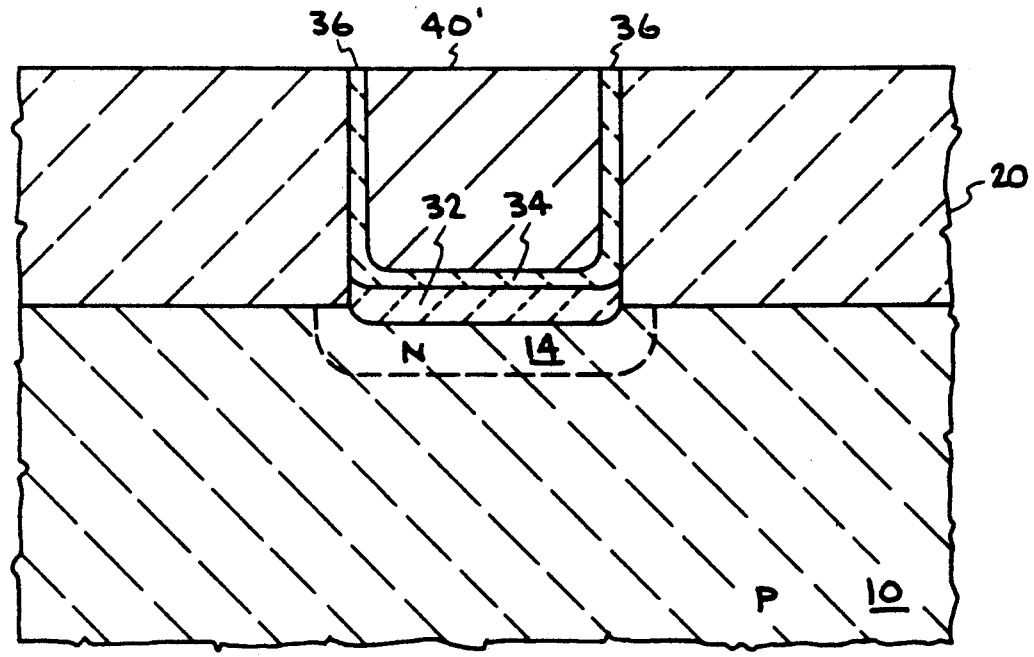
FIG. 4 is a fragmentary side-section view of the structure of FIG. 3 after the deposited tungsten has optionally been removed from the top surface of the insulator layer, leaving tungsten in only the contact opening in the insulator layer.

Alternatively, the structure may be planarized at this point, as shown in FIG. 4, to remove all tungsten (and titanium nitride) on top surface 22 of insulating layer 20, leaving only tungsten 40′ (and titanium nitride 34 and 36) in contact opening 24. This may be desirable, for example, if a different conductive material is to be used over insulating layer 20 as the conductive layer or wiring harness. Such planarizing may comprise any conventional planarization such as an anisotropic dry etch, a wet etch, or a combined chemical/mechanical wet etch.

It should be noted that while the steps of depositing titanium, annealing the titanium to form titanium silicide and titanium nitride, and tungsten deposition have all been described as being carried out in separate chambers, it will be understood that all of these steps may be carried out in separate vacuum apparatus, providing sufficient care is exercised during transfer of the wafer from one apparatus to another to not expose the coated wafer to contamination. For example, it is of particular importance that the titanium-coated wafer not be exposed to oxygen-bearing gases during the transfer from the titanium deposition chamber to the annealing chamber. On the other hand, all of the described titanium deposition, annealing, and tungsten deposition steps may be carried out in different stations in the same central vacuum chamber.

Preferably, however, each of the steps will be carried out in a separate chamber in the same vacuum apparatus so that each chamber may be designed to optimize the particular process to be performed therein and to avoid cross chamber contamination. The wafer is then transferred from one chamber to another in the same vacuum apparatus while maintaining the wafer under vacuum throughout the process.

Thus, the process of the invention provides an improved method of filling a high aspect ratio contact opening with tungsten wherein a silicide is formed between the exposed portion of the silicon substrate at the bottom of the contact opening and the tungsten filler material; a titanium nucleation layer is provided on the silicon oxide sidewall surfaces of the contact opening to facilitate formation of a good bond between the oxide sidewall surfaces and the tungsten filler material; and the formation of undesirable particles, while preparing the structure for the tungsten deposition is inhibited, in contrast to the prior art preparation steps.

Having thus described the invention what is claimed is:

1. A process for forming low resistance, low defect density, planar electrical contacts through a $SiO_2$ insulation layer to a silicon semiconductor wafer thereunder which comprises:
   a) sputtering depositing, in a PVD station in a vacuum apparatus, a layer of titanium over:
      i) exposed surfaces of said insulation layer, including sidewall insulation surfaces of a contact opening previously formed through said insulation layer to said silicon wafer; and
      ii) a surface of said silicon wafer exposed by said contact opening;
   b) transferring said titanium-coated wafer from said PVD station to an annealing station in a vacuum apparatus without exposing said titanium to oxygen-containing gases;
   c) initially annealing said deposited titanium at said annealing station within a temperature range of from about 500° C. to about 695° C. in the presence of a nitrogen-bearing gas, and in the absence of an oxygen-containing gas, to form titanium silicide over the exposed silicon wafer surface at the bottom of said contact opening and titanium nitride over said insulation surface and said titanium silicide;
   d) further annealing said titanium nitride and said titanium silicide within a temperature range of from about 800° C. to about 900° C.;
   e) transferring said wafer from said annealing station to a CVD station in a vacuum apparatus;
   f) depositing a layer of tungsten by a CVD process over:
      i) said titanium nitride surfaces on said $SiO_2$ insulating layer; and
      ii) said titanium nitride on said titanium silicide formed over said silicon substrate;
   to fill said contact opening with tungsten and form a planarized layer of tungsten over said titanium nitride-coated insulation layer;
   to thereby form a good electrical contact between said tungsten in said contact opening and said silicon wafer through said titanium nitride and titanium silicide, and a good bond between said tungsten and said titanium nitride formed on said surfaces of said insulating layer.

2. The process of claim 1 wherein said contact opening in said insulating layer has an aspect ratio of at least 1, and said step of depositing said titanium layer further comprises forming a layer of titanium over said exposed silicon surface at the bottom of said contact opening ranging in thickness from about 50 to about 1000 Angstroms.

3. The process of claim 1 wherein said annealing step in said presence of said nitrogen-bearing gas further comprises initially annealing said titanium coated wafer at a temperature ranging from about 650° C. to about 675° C. to form said titanium silicide and titanium nitride.

4. The process of claim 1 wherein said annealing step in said presence of said nitrogen-bearing gas further comprises maintaining the pressure within a range of from about 100 milliTorr to about 800 Torr during said annealing to form said titanium silicide and titanium nitride.

5. The process of claim 1 wherein an optional annealing step in the presence of an oxygen-bearing gas is carried out after said step of annealing in the presence of a nitrogen-bearing gas.

6. The process of claim 1 wherein said annealing step in said presence of said nitrogen-bearing gas further comprises:
   a) heating said titanium-coated wafer to an initial annealing temperature ranging from about 500° C. to about 695° C. at a rate of from about 5° C./second to about 150° C./second;
   b) annealing said titanium coated wafer at a temperature ranging from about 500° C. to about 695° C. for a period of from about 10 to about seconds to form said titanium silicide and titanium nitride; and
   c) then raising said annealing temperature to a second annealing temperature range of from about 800° C. to about 900° C. and maintaining said wafer within said second annealing temperature range for a period of from about 10 to about 60 seconds to convert to a more stable phase said titanium silicide initially formed within said temperature range of from about 500° C. to about 695° C.

7. The process of claim 1 wherein said step of depositing said tungsten further comprises depositing said tungsten in said contact opening by flowing a mixture of gases which include a tungsten-containing gas into a CVD station in a vacuum apparatus while maintaining a pressure ranging from about 500 milliTorr to about 760 Torr.

8. The process of claim 1 wherein said step of depositing said, tungsten in said contact opening further comprises flowing a gaseous mixture comprising $WF_6$ and $H_2$ gases and an inert carrier gas through the deposition station.

9. The process of claim 1 wherein said step of depositing said tungsten in said contact opening further comprises flowing WF$_6$ and H$_2$ gases and an inert carrier gas through the deposition station at a rate of from about 20 to about 200 sccm of WF$_6$; from about 100 to about 5000 sccm of said inert carrier gas; and from about 300 to about 3000 sccm of hydrogen.

10. The process of claim 7 wherein said step of depositing said tungsten in said contact opening further comprises mounting said wafer on a susceptor in said CVD station and maintaining the temperature of said susceptor within a range of from about 350° C. to about 525° C. during said deposition.

11. The process of claim 1 wherein said station for deposition of said titanium over said surfaces of said insulating layer and on said exposed portion of said silicon wafer; said annealing station for annealing said titanium to form said titanium silicide and titanium nitride; and said station for depositing a layer of tungsten over insulating layer to fill said contact opening with tungsten are all located in separate chambers of the same vacuum apparatus whereby said wafer may be transported from one chamber to another without exposing said wafer to contamination.

12. The process of claim 1 wherein said annealing step further comprises annealing said titanium coated wafer at an initial temperature ranging from about 650° C. to about 675° C. to form said titanium silicide and titanium nitride.

13. The process of claim 1 wherein said step of depositing said tungsten further comprises depositing said tungsten in said contact opening by flowing a mixture of gases which include a tungsten-containing gas into a CVD station in a vacuum apparatus while maintaining a pressure ranging from about 500 milliTorr to about 760 Torr.

14. The process of claim 1 wherein said step of depositing said tungsten in said contact opening further comprises flowing a gaseous mixture comprising WF$_6$ and H$_2$ gases and an inert carrier gas through said CVD station.

15. The process of claim 1 wherein said step of depositing said tungsten in said contact opening further comprises flowing nitrogen through said CVD with said mixture of WF$_6$ and H$_2$ gases and an inert carrier gas.

16. The process of claim 1 wherein said step of depositing said tungsten in said contact opening further comprises mounting said wafer on a susceptor in said CVD station and maintaining the temperature of said susceptor within a range of from about 350° C. to about 525° C. during said tungsten deposition.

17. The process of claim 1 wherein said PVD titanium sputtering step, said annealing step, and said tungsten CVD step are all carried out in the same chamber in said vacuum apparatus.

18. A process for forming low resistance, low defect density, electrical contacts through a SiO$_2$ insulation layer to a silicon semiconductor wafer thereunder which comprises:
  a) sputter depositing, in a PVD station in a vacuum apparatus, a layer of titanium over:
    i) exposed surfaces of said insulation layer, including sidewall insulation surfaces of a contact opening previously formed through said insulation layer to said silicon wafer; and
    ii) a surface of said silicon wafer exposed by said contact opening to a thickness of from about 50 to about 1000 Angstroms over said silicon surface;
  b) transferring said titanium-coated wafer from said PVD station to an annealing station in a vacuum apparatus without exposing said titanium to oxygen-containing gases;
  c) initially annealing said deposited titanium at said annealing station within a temperature range of from about 500° C. to about 695° C. in the presence of a nitrogen-bearing gas, and in the absence of an oxygen-containing gas, to form titanium silicide over the exposed silicon wafer surface at the bottom of said contact opening and titanium nitride over said insulation surface and said titanium silicide;
  d) further annealing said titanium nitride and said titanium silicide within a temperature range of from about 800° C. to about 900° C.;
  e) transferring said wafer from said annealing station to a CVD station in a vacuum apparatus;
  f) depositing a layer of tungsten over said titanium nitride surfaces on said SiO$_2$ insulating layer and said titanium silicide surface over said silicon substrate to fill said contact opening with tungsten by a CVD process which comprises:
    i) mounting said wafer on a susceptor in said CVD station;
    ii) flowing a mixture of WF$_6$ and H$_2$ gases and an inert carrier gas through the deposition station at a rate of from about 20 to about 200 sccm of WF$_6$, from about 100 to about 5000 sccm of said inert carrier gas, and from about 300 to about 3000 sccm of hydrogen;
    iii) maintaining the temperature of said susceptor within a range of from about 350° C. to about 525° C. during said CVD deposition; and
    iv) maintaining a pressure in said CVD station ranging from about 500 milliTorr to about 760 Torr during said CVD deposition;

to thereby form a good electrical contact between said tungsten in said contact opening and said silicon wafer through said titanium nitride and titanium silicide, and a good bond between said tungsten and said titanium nitride formed on said surfaces of said insulating layer.

* * * * *